United States Patent [19]
Hiraoka et al.

[11] Patent Number: 5,929,629
[45] Date of Patent: Jul. 27, 1999

[54] MAGNETIC SENSOR HAVING A LIQUID SEAL

[75] Inventors: Naoki Hiraoka; Hiroshi Sakanoue; Noriaki Hayashi; Wataru Fukui; Yutaka Ohashi, all of Tokyo, Japan

[73] Assignee: Mitsubishi Denki Kabushiki Kaisha, Tokyo, Japan

[21] Appl. No.: 08/927,256

[22] Filed: Sep. 11, 1997

[30]     Foreign Application Priority Data

Feb. 25, 1997 [JP] Japan .................................. 9-040924

[51] Int. Cl.⁶ .................. G01P 1/02; G01P 3/44; H05K 5/06; G01R 33/00
[52] U.S. Cl. ................. 324/174; 174/52.3; 324/207.2
[58] Field of Search .................................. 324/173, 174, 324/207.15, 207.16, 207.2, 207.21, 207.25, 251, 252; 174/17.06, 52.3

[56]         References Cited

U.S. PATENT DOCUMENTS

| 5,381,089 | 1/1995 | Dickmeyer et al. ............ 324/207.15 X |
| 5,627,464 | 5/1997 | Shinjo et al. ......................... 324/207.2 |

FOREIGN PATENT DOCUMENTS

| 43 41 890 A1 | 6/1994 | Germany . |
| 195 23 322 A1 | 1/1997 | Germany . |
| 6-347526 | 12/1994 | Japan . |

*Primary Examiner*—Gerard Strecker
*Attorney, Agent, or Firm*—Sughrue, Mion, Zinn, Macpeak & Seas, PLLC

[57]             ABSTRACT

The invention provides a high-accuracy and high-reliability magnetic sensor which can be produced with a high production yield at a low cost. The magnetic sensor includes: a main sensor unit including: an intermediate part in the form of a short rectangular prism serving as a fitting part; a seating formed on one end face of the intermediate part such that the seating has a step shape and such that the exterior circumferential surface of the seating serves as a fitting-in portion; a main part disposed at a right angle on the principal surface of the seating, the main part including: a sensor element disposed on the end of the main part; a permanent magnet disposed adjacent to the sensor element; and an electronic component; and a connector extending from the intermediate part; and a case including: a sleeve in the form of a cylinder with a closed end and an open end, the sleeve having a receiving portion formed on the open end, the sleeve having a sealed space serving as a space in which the main part is placed; and a holding part extending from the sleeve and including a receiving part and a separation stopper; wherein the magnetic sensor is characterized in that a liquid reservoir space is formed between the fitting-in portion and the receiving portion along the circumference, and the liquid reservoir space is filled with liquid packing.

4 Claims, 4 Drawing Sheets

MAGNETIC SENSOR HAVING A LIQUID SEAL

BACKGROUND OF THE INVENTION

1. Field of the Invention

The present invention relates to a magnetic sensor for detecting the speed of rotation for example of a gear-shaped magnetic rotor, and also to a method of producing such a magnetic sensor.

2. Description of the Related Art

FIG. 8 is a side view of a conventional magnetic sensor and a gear-shaped magnetic rotor detected by the magnetic sensor. FIG. 9 is a cross-sectional view taken along line IX—IX of FIG. 8. In FIGS. 8 and 9, the magnetic sensor includes: a main sensor unit 1 made up of an electric insulating resin on which an electric component is mounted; and a case 2 made up of an electric insulating resin covering the main sensor unit 1 in a sealed fashion. The main sensor unit 1 includes a main part 1a, a seating 1b, an intermediate part 1c, and a connector 1d. The main part 1a includes a Hall element 3 which is the most important component of the magnetic sensor, a permanent magnet 4, and a circuit board 7 on which a circuit pattern 6 is formed and on which electronic components 5 are mounted.

The intermediate part 1c has a substantially rectangular shape with a small length wherein the seating 1b with the shape of a circular step is formed on one end of the intermediate part 1c such that the axis of the seating 1b is coincident with that of the intermediate part 1c. The end face of the intermediate part 1c is formed into a substantially rectangular shape, and the diameter of the seating 1b is less than the side length of the intermediate part 1c.

The exterior circumferential surface of the seating 1b serves as a fitting-in portion 1e fitted into the case 2 which will be described in detail later. An O-ring groove 1f is formed along the circumference of the fitting-in portion 1e, and an O-ring 9 is disposed in the O-ring groove 1f. When the components are assembled into a complete magnetic sensor, the seating 1b is fitted in an opening at an end of the case 2 so that a closed space is created in the case 2. The main part 1a is disposed on the principal surface of the seating 1b in such a manner that the main part 1a extends in a direction perpendicular to the principal surface of the seating 1b.

The main part 1a is formed into the shape of a substantially rectangular and long plate, and one end of the main part 1a is connected at a right angle to the principal surface of the seating 1b. The circuit board 7 is mounted on one principal surface of the main part 1a. The permanent magnet 4 is mounted at a right angle on the other end of the main part 1a. The Hall element 3 serving as the sensor element for detecting the magnetic material approaching the sensor element is disposed on the outer-side principal surface of the permanent magnet 4.

The connector 1d extends from the other end face of the intermediate part 1c. After extending from the other end face of the intermediate part 1c in a direction opposite to the main part 1a, the connector 1d bends into a direction perpendicular to the main part 1a. Terminals electrically connected to the circuit pattern 6 of the main part 1a are embedded in the connector 1d. A receiving cavity is formed in the L-shaped end portion of the connector 1d and the terminals 8 project into the receiving cavity so that a connector of an external device can be fitted into the receiving cavity.

The main sensor unit 1 is produced by forming the main part 1a, the seating 1b, the intermediate part 1c, and the connector 1d in an integral form including the terminals 8 embedded therein by means of molding. After that, the Hall element 3, the permanent magnet 4, and the circuit board 7 are attached.

The case 2 is produced in an integral fashion by means of molding in such a manner as to include: a sleeve 2a in the form of a cylinder with a closed end; a flange which is formed at an open end of the sleeve 2a by increasing the wall thickness of the end portion of sleeve 2a in outward radial directions; a supporting projection 2c extending outward in a radial direction from the flange 2b; and a holder 2d including three plates extending from the principal surface of the flange 2b in a direction parallel to the sleeve 2a.

The sleeve 2a produced into the form of the cylinder with the closed end has a length similar to that of the main part 1a of the main sensor unit 1, and has an inner diameter slightly greater than the width of the main part 1a. The main part 1a of the main sensor unit 1 is placed in the sleeve 2a in such a manner that the central axis of the main part 1a is coincident with that of the sleeve. The Hall element 2 disposed on the end of the main part 1a is in contact with the closed end of the sleeve 2a. The sleeve 2a has a receiving portion 2e, inside the sleeve at its open end, for receiving the seating 1b of the main sensor unit 1.

As described earlier, the O-ring 9 is disposed on the seating 1b of the main sensor unit 1. The inner diameter of the receiving portion 2e formed at the open end of the sleeve 2a is slightly greater than the diameter of the seating 1b. The seating 1b is loosely fitted into the sleeve 2a in such a manner that the open end of the sleeve 2a is closed with the seating 1b. The O-ring 9 serves to seal the connection between the seating 1b and the open end of the sleeve so that a tightly sealed space is created in the case 2. The main part 1a of the main sensor unit 1 is placed in this tightly sealed space. The O-ring 9 serves not only to seal the case 2 but also to position the main part 1a of the main sensor unit 1 at the center of the case 2.

The flange 2b is formed by increasing the wall thickness of the open end portion of the sleeve 2a outward in radial directions over the entire circumference. The supporting projection 2c extends outward in a radial direction from the flange 2b. A fixing hole 2f is formed in the end portion of the supporting projection 2c in such a manner that the fixing hole 2f extends in parallel to the axis of the sleeve 2a. The magnetic sensor is fixed to a desired location with a screw (not shown) fitted into the fixing hole 2f formed in the supporting projection 2c.

The holder 2d is composed of three plates extending from the principal surface of the flange 2b in the direction parallel to the axis of the sleeve 2a. The three plates are disposed in such a manner that the principal surface of each plate is in contact with corresponding one of three side surfaces of the intermediate part 1c of the main part 1. Because three side faces of the intermediate part 1c are in contact with the corresponding principal surfaces of the holder 2d, the main sensor unit 1 is prevented from rotating relative to the case 2. The intermediate part 1c and the holder 2d serve as a fitting-in part and receiving part, respectively, which are fitted to each other such that the main part 1a is firmly placed in the sleeve 2a without encountering relative rotation.

At the final stage of production process, the upper end portions 2g of the holder 2d are bent inward into an L shape in cross section along the entire length, by means of heat caulking. The upper end portions 2g are in contact with the corner of the end face of the intermediate part 1c of the main sensor unit 1 and thus the upper end portions 2g serve to prevent the main part 1a from moving outward from the inside of the sleeve 2a.

The magnetic sensor constructed in the above-described manner is fixed to a desired location with a screw fitted through the fixing hole 2f formed in the supporting projection 2b. When a gear-shaped magnetic rotor 20 made up of a magnetic material such as a iron disposed near the magnetic sensor is rotated, the recessed portions 20a and the protruding portions 20b alternately approach and pass by the Hall element 3. As a result, a variation occurs in the magnetic field which emerges from the permanent magnet 4 and is applied to the Hall element 3. The variation in the magnetic field is detected as a variation in voltage by the Hall element 3. The variation in voltage generated by the Hall element 3 is then converted by the electronic components 5 into a pulse signal. The electric signal in the pulse form is transmitted to an external device (not shown) via the terminals 8 of the connector 1d so as to detect the speed of rotation of the magnetic rotor 20.

In the production process of the magnetic sensor, a resin part of the main sensor unit 1 is first produced by forming the main part 1a, the seating 1b, the intermediate part 1c, and the connector 1d in an integral form including the terminals 8 embedded therein by means of molding. The Hall element 3, the permanent magnet 4, and the circuit board 7 are then mounted on the above resin part. The case 2 is also produced in an integral fashion by means of molding. Then the main sensor unit 1 is inserted into the case 2, and the upper end portions 2g of the holder 2d of the case 2 are caulked at a high temperature so that the main sensor unit 1 and the case 2 are combined together into a completely integral form.

The conventional magnetic sensor described above has the following problems. When the main sensor unit 1 and the case 2 are produced by means of molding, flash occurs at the mold juncture. In general, the mold is divided into two parts along a longitudinal direction. In the specific example of the magnetic sensor described above, the mold used in the resin molding process for the main sensor unit 1 is divided along the longitudinal axis of the main part 1a. As a result, flash can occur such that the flash extends across the O-ring groove 1f. Such flash across the O-ring groove 1f causes a leaky seal between the O-ring 9 and the O-ring groove 1f. This causes a reduction in production yield, which is a serious problem.

Furthermore, in the above conventional technique, the main sensor unit 1 is positioned with respect to the case 2 via the O-ring 9. However, because the O-ring 9 is made up of an elastic material which can change in shape, the position of the main sensor unit 1 cannot be perfectly fixed relative to the case 2. This causes a reduction in the sensor accuracy.

Thus, it is a general object of the present invention to solve the above problems. More specifically, it is an object of the present invention to provide a high-reliability magnetic sensor which can be produced with a high yield and at a low cost.

SUMMARY OF THE INVENTION

According to an aspect of the present invention, there is provided a magnetic sensor including:
   a main sensor unit including:
      an intermediate part in the form of a short rectangular prism serving as a fitting part;
      a seating formed on one end face of the intermediate part such that the seating has a step shape and such that the exterior circumferential surface of the seating serves as a fitting-in portion;
      a long plate shaped main part disposed at a right angle on the principal surface of the seating, the main part including: a sensor element disposed on the end of the main part, for detecting the approaching motion of a magnetic member; a permanent magnet disposed adjacent to the sensor element, for generating a magnetic field applied to the sensor element; and an electronic component electrically connected to the sensor element; and
      a connector extending from the intermediate part, the connector including an terminal for transmitting an output signal of the sensor element to the outside; and
   a case including:
      a sleeve in the form of a cylinder with a closed end and an open end, the sleeve having a receiving portion formed on the open end, the receiving portion serving to create a sealed space inside the sleeve in cooperation with the fitting-in portion, the sealed space serving as a space in which the main part is placed;
      a receiving part extending from the open end of the sleeve, the receiving part serving to receive the fitting-in part in such a manner that the main part is prevented from rotating relative to the sleeve; and
      a holding part including a separation stopper for preventing the main part from moving off from the inside of the sleeve;
   the magnetic sensor being characterized in that a liquid reservoir space is formed between the fitting-in portion and the receiving portion along the circumference, and the liquid reservoir space is filled with liquid packing.

Preferably, the fitting-in portion is pressed into the receiving portion so that the fitting-in portion is firmly fitted into the receiving portion.

The liquid reservoir space is preferably formed at a tailing end of the fitting-in portion wherein the tailing end denotes a tailing end with respect to the fitting direction.

DESCRIPTION OF THE PREFERRED EMBODIMENTS

First Embodiment

Figure 1:
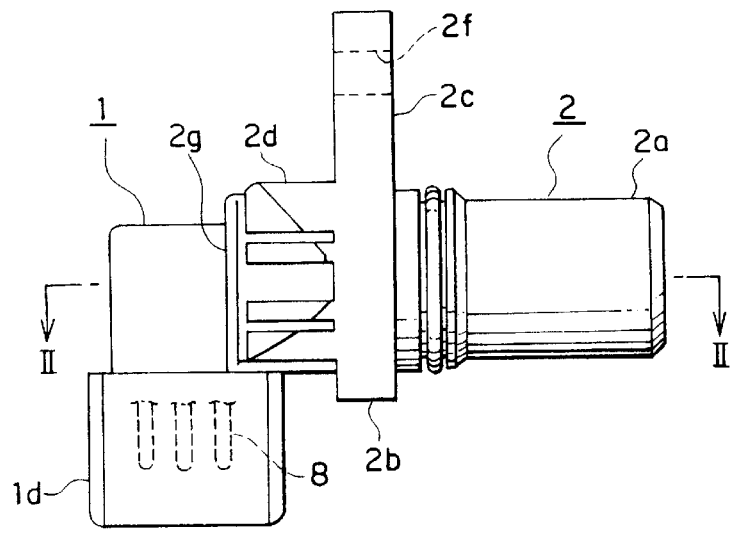
FIG. 1 is a side view of a magnetic sensor according to the present invention.
Figure 2:
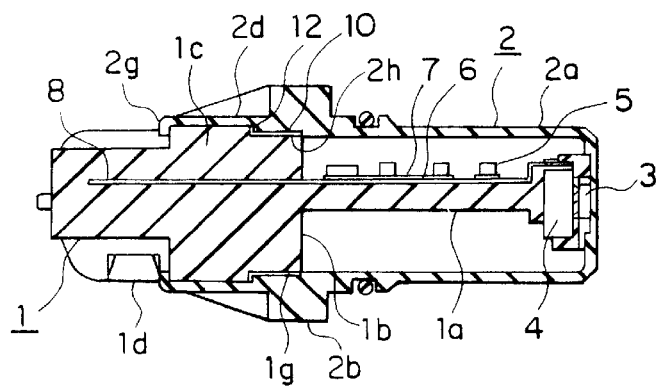
FIG. 2 is cross-sectional view taken along line II—II of FIG. 1.
Figure 3:
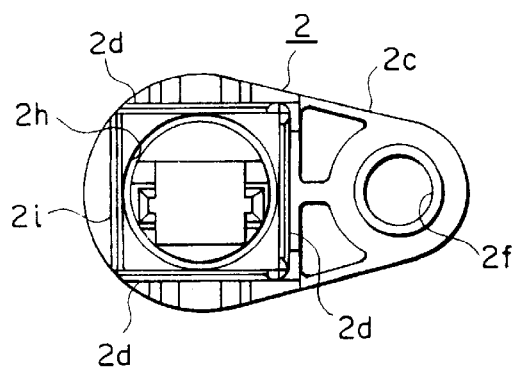
FIG. 3 is a schematic diagram of a case viewed from the open end side.
Figure 4:
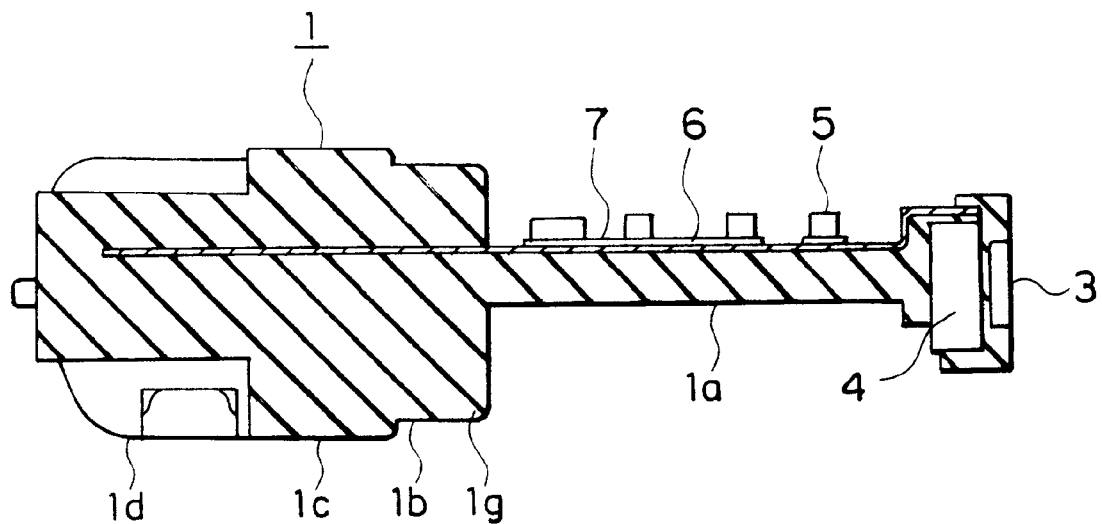
FIG. 4 is a cross-sectional view of a main sensor unit in a state before being assembled into the case.
Figure 5:
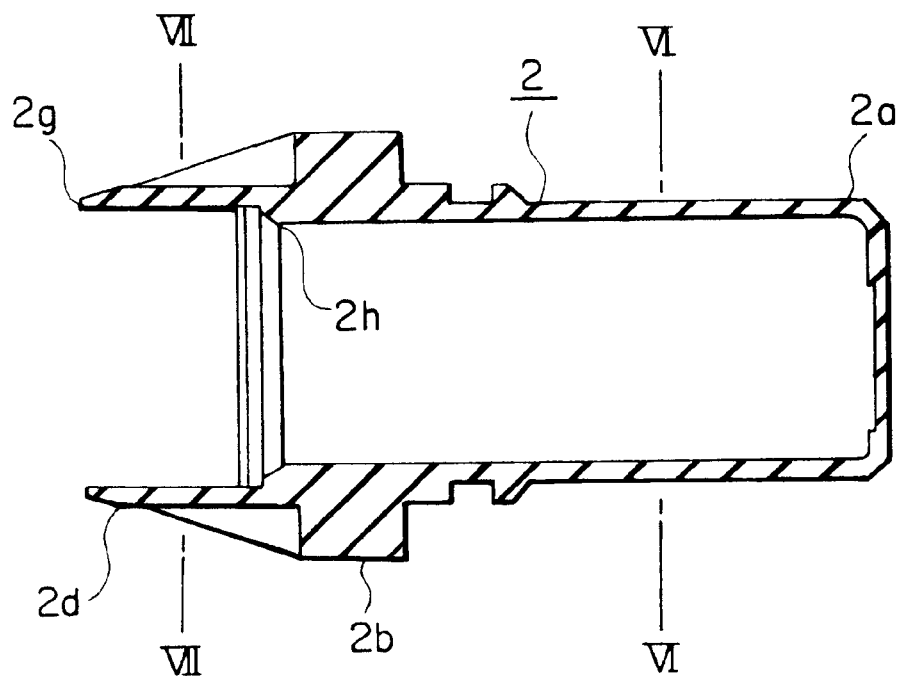
FIG. 5 is a cross-sectional view of the case in a state before receiving the main sensor unit.
Figure 6:
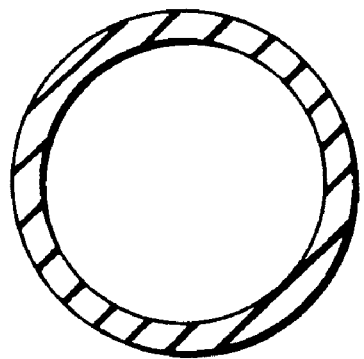
FIG. 6 is a cross-sectional view of the case taken along line VI—VI of FIG.
Figure 7:
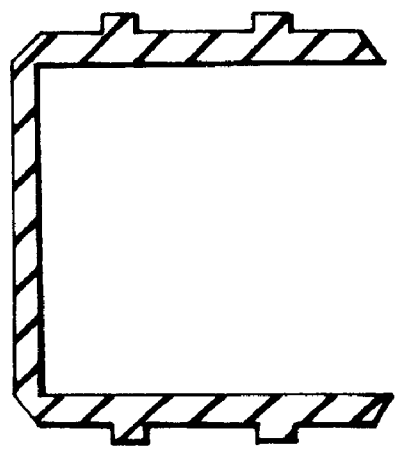
FIG. 7 is a cross-sectional view of the case taken along line VII—VII of FIG. 5.
Figure 8:
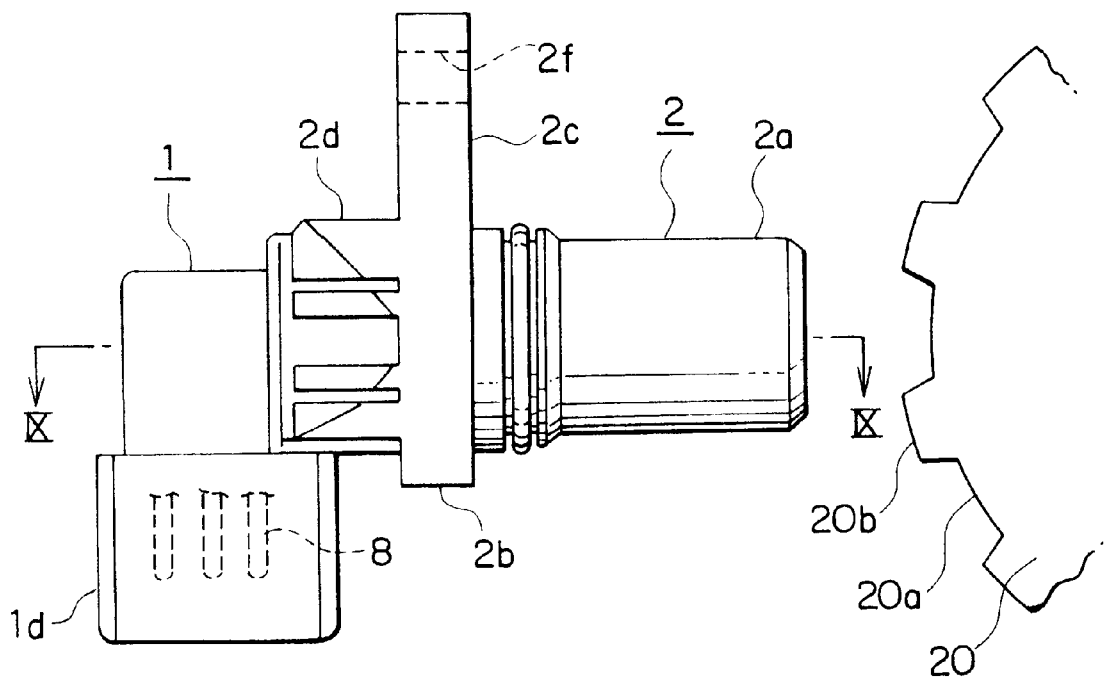
FIG. 8 is a side view of a conventional magnetic sensor and a gear-shaped magnetic rotor detected by the magnetic sensor.
Figure 9:
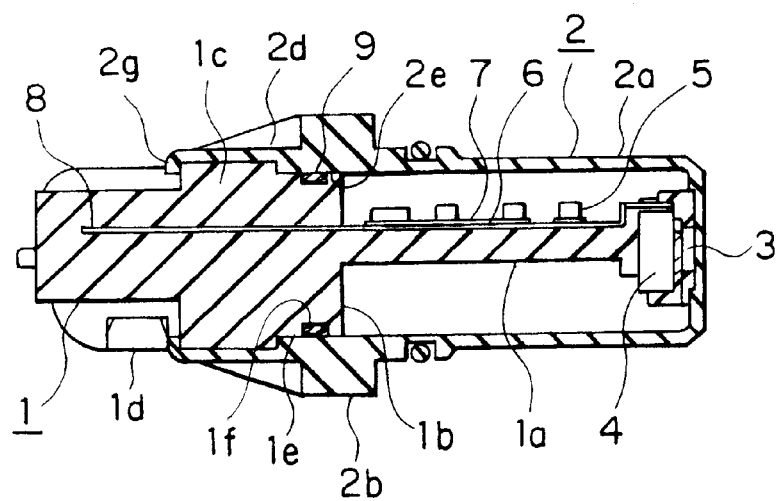
FIG. 9 is a cross-sectional view taken along line IX—IX of FIG. 8.

FIG. 1 is a side view of a magnetic sensor according to the present invention. FIG. 2 is cross-sectional view taken along line II—II of FIG. 1. FIG. 3 is a schematic diagram of a case viewed from the open end side; FIG. 4 is a cross-sectional view of a main sensor unit in a state before being assembled into the case. FIG. 5 is a cross-sectional view of the case in a state before receiving the main sensor unit. FIG. 6 is a cross-sectional view of the case taken along line VI—VI of FIG. 5, and FIG. 7 is a cross-sectional view taken along line VII—VII. In FIGS. 1–5, the magnetic sensor includes: a main sensor unit 1 made up of an electric insulating resin on which an electric component is mounted; and a case 2 made up of an electric insulating resin covering the main sensor unit 1 in a sealed fashion. The main sensor unit 1 includes a main part 1a, a seating 1b, an intermediate part 1c, and a connector 1d. The main part 1a includes a Hall element 3 which is the most importance component of the magnetic sensor, a permanent magnet 4, and a circuit board 7 on which a circuit pattern 6 is formed and on which electronic components 5 are mounted.

The intermediate part 1c has a substantially rectangular shape with a small length wherein a seating 1b with a shape of a circular step is formed on one end of the intermediate part 1c such that the axis of the seating 1b is coincident with that of the intermediate part 1c. The end face of the intermediate part 1c is formed into a substantially rectangular shape, and the diameter of the seating 1b is less than the side length of the intermediate part 1c.

The exterior circumferential surface of the seating 1b serves as a fitting-in portion 1g fitted into the case 2 which will be described in detail later. When the components are assembled into a complete magnetic sensor, the seating 1b is fitted in an opening at an end of the case 2 so that a closed space is created in the case 2. The main part 1a is disposed on the principal surface of the seating 1b in such a manner that the main part 1a extends in a direction perpendicular to the principal surface of the seating 1b.

The main part 1a is formed in the shape of a substantially rectangular and long plate, and one end of the main part 1a is connected at a right angle to the principal surface of the seating 1b. The circuit board 7 is mounted on one principal surface of the main part 1a. The permanent magnet 4 is mounted at a right angle on the other end of the main part 1a. The Hall element 3 serving as a sensor element for detecting a magnetic material approaching the sensor element is disposed on the outer-side principal surface of the permanent magnet 4.

The connector 1d extends from the other end face of the intermediate part 1c. After extending from the other end face of the intermediate part 1c in a direction opposite to the main part 1a, the connector 1d bends into a direction perpendicular to the main part 1a. Terminals electrically connected to the circuit pattern 6 of the main part 1a are embedded in the connector 1d. A receiving cavity is formed in the L-shaped end portion of the connector 1d and the terminals 8 project into the receiving cavity so that a connector of an external device can be fitted into the receiving cavity.

The main sensor unit 1 is produced by forming the main part 1a, the seating 1b, the intermediate part 1c, and the connector 1d in an integral form including the terminals 8 embedded therein by means of molding. After that, the Hall element 3, the permanent magnet 4, and the circuit board 7 are attached.

The case 2 is produced in an integral fashion by means of molding in such a manner as to include: a sleeve 2a in the form of a cylinder with a closed end; a flange which is formed at an open end of the sleeve 2a by increasing the wall thickness of the end portion of sleeve 2a in an outward direction; a supporting projection 2c extending outward in a radial direction from the flange 2b; and a holder 2d including three plates extending from the principal surface of the flange 2b in a direction parallel to the sleeve 2a.

The sleeve 2a, which is produced into the form of the cylinder having a circular shape in cross section and having the closed end as shown in FIG. 6, has a length similar to that of the main part 1a of the main sensor unit 1, and has an inner diameter slightly greater than the width of the main part 1a. The main part 1a of the main sensor unit 1 is placed in the sleeve 2a in such a manner that the central axis of the main part 1a is coincident with that of the sleeve. The Hall element 2 disposed on the end of the main part 1a is in contact with the closed end of the sleeve 2a. The sleeve 2a has a receiving portion 2h, inside the sleeve at its open end, for receiving the seating 1b of the main sensor unit 1.

The inner diameter of the receiving portion 2h formed at the open end of the sleeve 2a is substantially equal to the diameter of the seating 1b. The seating 1b is pressed into the sleeve so that the seating 1b is tightly fitted into the sleeve 2a and so that the open end of the sleeve 2a is closed with the seating 1b. Liquid packing such as silicone 10 is provided such that it penetrates between the fitting-in portion 1g and the receiving portion 2h. The length of the receiving portion 2h is set to be slightly smaller than that of the fitting-in portion 1g so that a gap 12 is created between the main sensor unit 1 and the case 2. This small space 12 is surrounded by the exterior circumferential surface of the fitting-in portion 1g, the end face of the intermediate part 1c, the open end face of the sleeve 2a, and the inner-side principal surface of the holder 2d. The space 12 is filled with the liquid packing 10. That is, the space 12 serves as a liquid reservoir. The liquid packing 10 penetrating between the fitting-in portion 1g and the receiving portion 2h and the liquid packing 10 filled in the space 12 serve to seal the connection between the opening of the case 2 and the seating 1b. Thus, the sealed space is created in the case 2 and the main part 1a of the main sensor unit 1 is placed in the sealed space.

The flange 2b is formed by increasing the wall thickness of the open end portion of the sleeve 2a outward in radial directions over the entire circumference. The supporting projection 2c extends outward in a radial direction from the flange 2b. A fixing hole 2f is formed in the end portion of the supporting projection 2c in such a manner that the fixing hole 2f extends in parallel to the axis of the sleeve 2a. The magnetic sensor is fixed to a desired location with a screw (not shown) fitted through the fixing hole 2f formed in the supporting projection 2c.

The holder 2d is composed of three plates extending from the principal surface of the flange 2b in the direction parallel to the axis of the sleeve 2a. The three plates are disposed in such a manner that the principal surface of each plate is in contact with corresponding one of three side surfaces of the intermediate part 1c of the main part 1. Because the three side faces of the intermediate part 1c are in contact with the corresponding principal surfaces of the holder 2d, the main sensor unit 1 is prevented from rotating relative to the case 2. The intermediate part 1c and the holder 2d serve as a fitting-in part and receiving part, respectively, which are fitted to each other such that the main part 1a is firmly placed in the sleeve 2a without encountering relative rotation. A low dam 2i is formed on the remaining side surface of the intermediate part 1c on which no plate of the holder 2d is disposed wherein the dam 2i extends from the principal surface of the flange 2b in a direction parallel to the axis of the sleeve 2a.

At the final stage of production process, the upper end portions 2g of the holder 2d are bent inward into an L shape in cross section along the entire length, by means of heat caulking. The upper end portions 2g are in contact with the corner of the end face of the intermediate part 1c of the main sensor unit 1 and thus the upper end portions 2g serve to prevent the main part 1a from moving outward from the inside of the sleeve 2a.

The magnetic sensor constructed in the above-described manner is fixed to a desired location with a screw fitted through the fixing hole 25 formed in the supporting projection 2b. When a gear-shaped magnetic rotor 20 made up of a magnetic material disposed near the magnetic sensor is rotated, the recessed portions 20a and the protruding portions 20b alternately approach and pass by the Hall element 3. As a result, a variation occurs in the magnetic field which emerges from the permanent magnet 4 and is applied to the Hall element 3. The variation in the magnetic field is detected as a variation in voltage by the Hall element 3. The variation in voltage generated by the Hall element 3 is then converted by the electronic components 5 into a pulse signal. The electric signal in the pulse form is transmitted to an external device (not shown) via the terminals 8 of the connector 1d so as to detect the speed of rotation of the magnetic rotor 20.

In the production process of the magnetic sensor, a resin part of the main sensor unit 1 is first produced by forming the main part 1a, the seating 1b, the intermediate part 1c, and the connector 1d in an integral form including the terminals 8 embedded therein by means of molding. The Hall element 3, the permanent magnet 4, and the circuit board 7 are then mounted on the above resin part. The case 2 is also produced in an integral fashion by means of molding. Then the main sensor unit 1 is inserted into the case 2, and the upper end portions 2g of the holder 2d of the case 2 are caulked at a high temperature so that the main sensor unit 1 and the case 2 are combined together into a completely integral form.

In the magnetic sensor of the present invention, the diameter of the fitting-in portion 1g of the main sensor unit 1 is substantially equal to the inner diameter of the receiving portion 2h, and the fitting-in portion 1g is pressed into the receiving portion 2h so that the fitting-in portion 1g is tightly fitted into the receiving portion 2h. When the fitting-in portion 1g is tightly fitted into the receiving portion 2h, the main part 1a of the main sensor unit 1 is positioned at the center of the case 2. Furthermore, in the magnetic sensor of the present invention, neither O-ring groove is formed on the main sensor unit 1 nor O-ring is provided.

In the production process of the magnetic sensor according to the invention, a resin part of the main sensor unit 1 is first produced into the form including the terminals 8 embedded therein, as in the conventional technique described above. The Hall element 3, the permanent magnet 4, and the circuit board 7 are then mounted on the above resin part. The case 2 is also produced in an integral fashion by means of molding. Before the main sensor unit 1 is combined into the case 2, the fitting-in portion 1g of the main sensor unit 1 is coated with viscous liquid packing 10. Then the main part 1a of the main sensor unit 1 is placed into the case 2, and the fitting-in portion 1g is pressed into the receiving portion 2h so that the fitting-in portion 1g is tightly fitted into the receiving portion 2h. Thus, the main sensor unit 1 is fitted to the case 2. After that, the end portions 2g of the holder 2d of the case 2 are caulked at a high temperature so that the main sensor unit 1 and the case 2 are firmly combined into a completely integral form.

When the fitting-in portion 1g is fitted into the receiving portion 2h, an excess of the liquid packing 10 coated on the fitting-in portion 1g is removed by the open end face of the sleeve 2a, and the remaining liquid packing 10 penetrates between the fitting-in portion 1g and the receiving portion 2h. The removed excess liquid packing is collected into the space 12 serving as the liquid reservoir and thus the space 12 is filled with the liquid packing. As a result, the connection between the main sensor unit 1 and the case is perfectly sealed. Even if flash is created on the fitting-in portion 1g, the liquid packing 10 absorbs the flash and thus the connection between the fitting-in portion 1g and the receiving portion 2h is perfectly sealed.

Since the fitting-in portion 1g of the main sensor unit 1 is firmly fitted into the receiving portion 2h, the main sensor unit 1 is firmly fixed to the case 2. As a result, the magnetic sensor has excellent resistance to vibration, and thus has improved reliability. Furthermore, the sensing accuracy is improved, and thus a high-accuracy and high-reliability magnetic sensor is achieved.

Although in the present embodiment, the fitting-in portion 1g is firmly fitted into the receiving portion 2h, the advantage and effect of the present invention may be achieved to a certain degree even if the fitting-in portion 1g is loosely fitted into the receiving portion 2h because the liquid packing 10 provides good sealing at the connection between the fitting-in portion 1g and the receiving portion 2h.

In the present invention, as described above, the magnetic sensor includes: the main sensor unit including: the intermediate part in the form of a short rectangular prism serving as the fitting part; the seating formed on one end face of the intermediate part such that the seating has a step shape and such that the exterior circumferential surface of the seating serves as the fitting-in portion; the long-plate shaped main part disposed at a right angle on the principal surface of the seating, the main part including: the sensor element disposed on the end of the main part, for detecting the approaching motion of a magnetic member; a permanent magnet disposed adjacent to the sensor element, for generating a magnetic field applied to the sensor element; and the electronic component electrically connected to the sensor element; and the connector extending from the intermediate part, the connector including an terminal for transmitting an output signal of the sensor element to the outside; and the case including: the sleeve in the form of a cylinder with a closed end and an open end, the sleeve having the receiving portion formed on the open end, the receiving portion serving to create the sealed space inside the sleeve in cooperation with the fitting-in portion, the sealed space serving as a space in which the main part is placed; the receiving part extending from the open end of the sleeve, the receiving part serving to receive the fitting-in part in such a manner that the main part is prevented from rotating relative to the sleeve; and the separation stopper for preventing the main part from moving off from the inside of the sleeve; wherein the magnetic sensor is characterized in that the liquid reservoir space is formed between the fitting-in portion and the receiving portion along the circumference, and the liquid reservoir space is filled with liquid packing.

In this magnetic sensor, even if flash is produced on the fitting-in portion, the liquid packing absorbs the flash and thus good sealing is maintained between the fitting-in portion and the receiving portion. As a result, highly reliable sealing is achieved and thus the magnetic sensor has high durability. Furthermore, the magnetic sensor can be produced with a high production yield at a low cost.

As described above, the fitting-in portion is preferably pressed into the receiving portion so that the fitting-in portion is firmly fitted into the receiving portion. As a result of the firm fitting between the fitting-in portion and the receiving portion, the main sensor unit 1 is firmly combined with the case. Therefore, the magnetic sensor has excellent resistance to vibration, and thus reliability is further improved. Furthermore, the sensing accuracy is improved, and thus a high-accuracy and high-reliability magnetic sensor is achieved.

The liquid reservoir space is preferably formed at a tailing end of the fitting-in portion wherein the tailing end denotes a tailing end with respect to the fitting direction. With this arrangement, an excess of the liquid packing coated on the fitting-in portion 1g removed, and the remaining liquid packing penetrates between the fitting-in portion and the receiving portion. The removed excess liquid packing is collected into the liquid reservoir space and thus the liquid reservoir space is filled with the liquid packing. This provides perfect sealing between the fitting-in portion and the receiving portion.

What is claimed is:

1. A magnetic sensor comprising:

a main sensor unit comprising:

an intermediate part in the form of a short rectangular prism serving as a fitting part;

a seating formed on one end face of said intermediate part, said seating having a circumferential surface with a step, the exterior of said circumferential surface of said seating serving as a fitting in portion;

a long-plate shaped main part disposed at a right angle on the principal surface of said seating, said main part including: a sensor element disposed on the end of said main part, for detecting the approaching motion of a magnetic member; a permanent magnet disposed adjacent to said sensor element, for generating a magnetic field applied to said sensor element; and an electronic component electrically connected to said sensor element; and a connector extending from said intermediate part, said connector including a terminal for transmitting an output signal of said sensor element to the outside; and a case comprising:

a sleeve in the form of a cylinder with a closed end and an open end, said sleeve having a receiving portion formed on the open end, said receiving portion serving to create a sealed space inside said sleeve in cooperation with said fitting-in portion, said sealed space serving as a space in which said main part is placed, the outer diameter of said fitting-in portion being substantially the same as the inner diameter of said receiving portion;

a receiving part extending from the open end of said sleeve, said receiving part serving to receive said fitting-in portion in such a manner that said main part is prevented from rotating relative to said sleeve; and a separation stopper for preventing said main part from moving off from the inside of said sleeve;

said magnetic sensor being characterized in that a liquid reservoir space is formed between said fitting-in portion and said receiving portion along the circumferential surface, and said liquid reservoir space is filled with liquid packing.

2. A magnetic sensor according to claim 1, wherein said fitting-in portion is pressed into said receiving portion so that said fitting-in portion is firmly fitted into said receiving portion.

3. A magnetic sensor according to claim 1, wherein said liquid reservoir space is formed at the step of said fitting-in portion, said step being located at a tailing end with respect to the fitting direction.

4. A magnetic sensor according to claim 2, wherein said liquid reservoir space is formed at the step of said fitting-in portion, said step being located at a tailing end with respect to the fitting direction.

* * * * *